United States Patent
Hayashi et al.

(12)

(10) Patent No.: US 6,365,825 B1
(45) Date of Patent: Apr. 2, 2002

(54) REVERSE BIASING APPARATUS FOR SOLAR BATTERY MODULE

(75) Inventors: Katsuhiko Hayashi, Shiga; Hideo Yamagishi, Kyoto, both of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/532,111

(22) Filed: Mar. 21, 2000

(30) Foreign Application Priority Data

| May 14, 1999 | (JP) | 11-134069 |
| Aug. 5, 1999 | (JP) | 11-222476 |
| Aug. 12, 1999 | (JP) | 11-228519 |
| Aug. 12, 1999 | (JP) | 11-228520 |

(51) Int. Cl.[7] .............................................. H01L 31/04
(52) U.S. Cl. .................. 136/290; 136/244; 136/258; 438/4; 438/12; 438/10; 438/88; 361/212; 361/225; 324/718
(58) Field of Search .................. 136/244, 290, 136/258; 438/4, 12, 10, 88; 324/718; 361/212, 255

(56) References Cited

U.S. PATENT DOCUMENTS

| 4,464,823 A | * | 8/1984 | Izu et al. ...................... 438/12 |
| 5,418,680 A | * | 5/1995 | Saito et al. .................. 361/225 |
| 6,228,662 B1 | * | 5/2001 | Hayashi et al. ............... 438/12 |

FOREIGN PATENT DOCUMENTS

| JP | 59-094468 | | 5/1984 |
| JP | 60-46080 A | * | 3/1985 |
| JP | 61-85873 A | * | 5/1986 |
| JP | 63-041081 | | 2/1988 |
| JP | 63-088869 | | 4/1988 |
| JP | 03-023677 | | 1/1991 |
| JP | 10-4202 A | * | 1/1998 |
| JP | 10-004202 | | 1/1998 |

* cited by examiner

Primary Examiner—Alan Diamond
(74) Attorney, Agent, or Firm—Hogan & Hartson, L.L.P.

(57) ABSTRACT

A reverse biasing apparatus is used to remove short-circuited portions in a solar battery module having multiple strings of solar cells each including a first electrode layer, a photovoltaic semiconductor layer and a second electrode layer formed on a glass substrate, by applying a reverse bias voltage between the electrodes of adjacent solar cells. The reverse biasing apparatus comprises probes to be in contact with the electrodes of adjacent three or more strings of solar cells, an actuator for actuating the probes up and down, and a relay switch for selecting, from the probes, a pair of probes for applying the reverse bias voltage between the electrodes of an arbitrary pair of adjacent solar cells. The use of the reverse biasing apparatus can ensure an efficient reverse biasing process on a solar battery module having integrated multiple strings of solar cells.

18 Claims, 6 Drawing Sheets

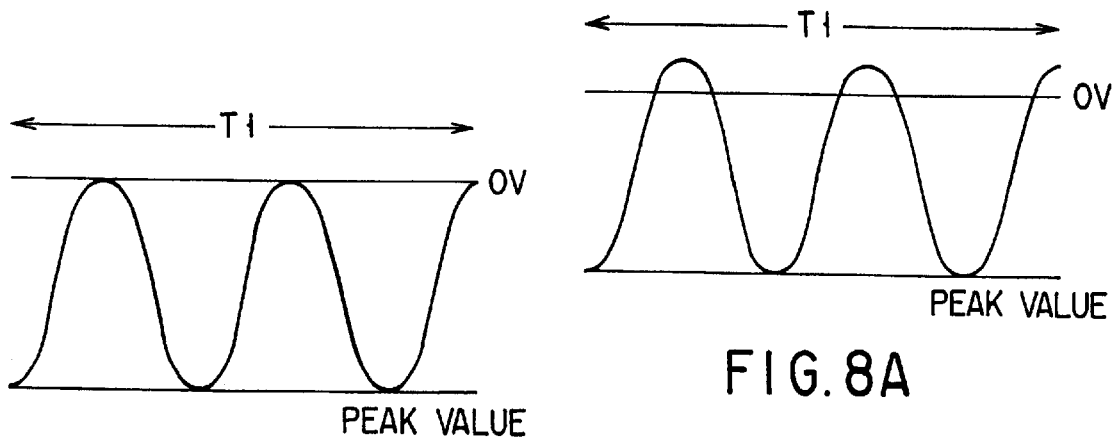
FIG. 7A
FIG. 8A
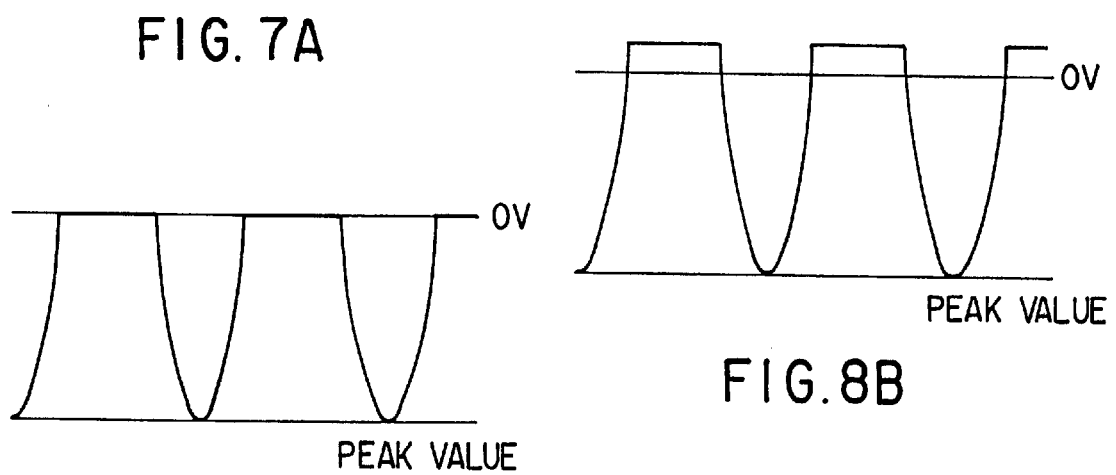
FIG. 7B
FIG. 8B
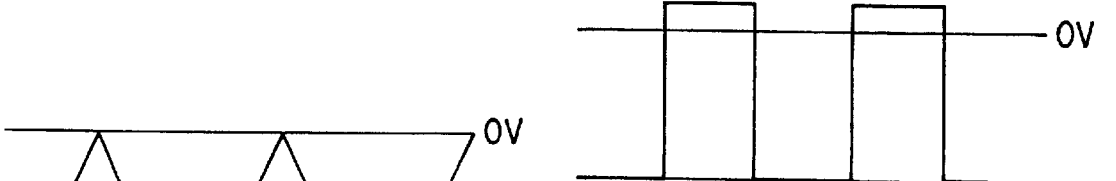
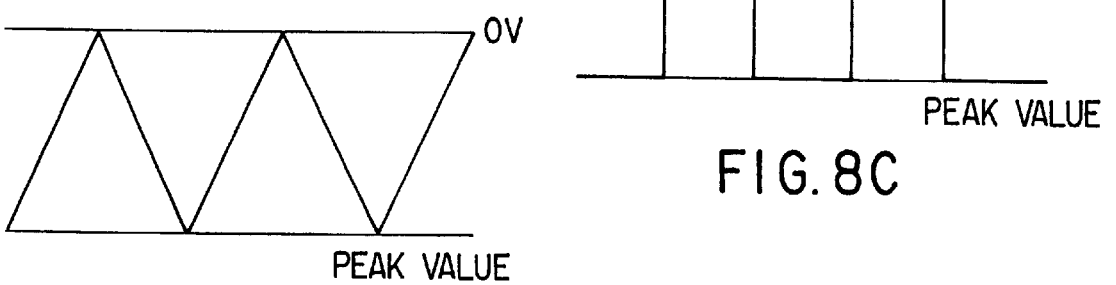
FIG. 7C
FIG. 8C
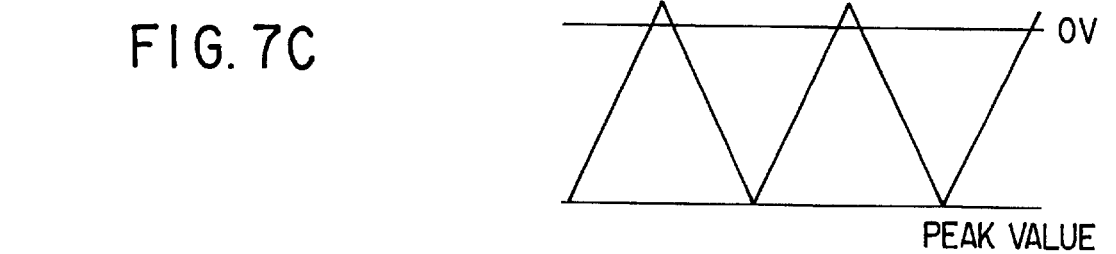
FIG. 8D

REVERSE BIASING APPARATUS FOR SOLAR BATTERY MODULE

CROSS-REFERENCE TO RELATED APPLICATIONS

This application is based upon and claims the benefit of priority from the prior Japanese Patent Applications No. 11-134069, filed May 14, 1999; No. 11-222476, filed Aug. 5, 1999; No. 11-228519, Aug. 12, 1999; and No. 11-228520, filed Aug. 12, 1999, the entire contents of which are incorporated herein by reference.

BACKGROUND OF THE INVENTION

The present invention relates to a reverse biasing apparatus for a solar battery module, particularly, for an amorphous thin-film solar battery module. More specifically, the present invention relates to an apparatus which applies a reverse bias voltage lower than a breakdown voltage between a substrate side electrode and a back electrode in a thin-film solar battery module, which sandwich a photovoltaic semiconductor layer that contributes to power generation, thereby removing short-circuited portions or oxidizing them to make into insulators by means of Joule heat.

FIGS. 1A and 1B show a structure of a thin-film solar battery module 10. As shown in those figures, a first electrode layer (transparent electrode) 2 of a transparent conductive oxide, such as $SnO_2$, is formed on an insulating substrate 1 such as glass, and is separated into strings by laser scribing. A photovoltaic semiconductor layer 3 having a stacked structure of, for example, a p-type a-Si layer, an i-type a-Si layer and an n-type a-Si layer is formed on the transparent electrode 2 and is separated into strings by laser scribing at positions different from the scribe lines of the transparent electrode 2. A second electrode layer (back electrode) 4 of metal is formed on the semiconductor layer 3, and is separated into strings by laser scribing at positions different from the scribe lines of the semiconductor layer 3. Shifting the scribe lines of each layer permits the end portion of the second electrode layer 4 of a given solar cell to be connected to the end portion of the first electrode layer 2 of an adjacent solar cell through the semiconductor scribe line, so that multiple solar cells are connected in series.

If a pin-hole is formed in the photovoltaic semiconductor layer in the individual solar cells that constitute the solar battery module during fabrication, the first electrode layer and the second electrode layer of that solar cell may be short-circuited to each other. Because the short-circuited solar cell does not contribute to power generation any more, the power generation characteristic of the solar battery is deteriorated. The power generation characteristic is improved by performing a process of applying a reverse bias voltage to the solar cells to eliminate the short-circuited portions (reverse biasing process).

Referring now to FIGS. 1A and 1B, a description will be given of the case where a short-circuited portion S is produced in a photovoltaic semiconductor layer 3b of a solar cell 5b. In this case, a pair of probes 6a and 6b are brought into contact with the second electrode layer 4b of the solar cell 5b and the second electrode layer 4c of the adjacent solar cell 5c (the second electrode layer 4c is connected in series to the first electrode layer 2b of the solar cell 5b), respectively, and apply a reverse bias voltage lower than the breakdown voltage between the first electrode layer 2b and the second electrode layer 4b which sandwich the photovoltaic semiconductor layer 3b that contributes to power generation. As the reverse bias voltage is applied, a current concentrates on the short-circuited portion, thereby generating Joule heat, and therefore, the metal material forming the second electrode layer is broken up or is oxidized into an insulating film at the short-circuited portion S. This eliminates the short-circuited portions, so that deterioration of the power generation characteristic at the time of operation can be suppressed.

A plurality of pin-holes are, however, randomly produced in each solar cell. In the case where the reverse bias voltage is applied to such a solar cell having pin-holes with a pair of probes in contact thereto, if there is a short-circuited portion S remote from the probes in the longitudinal direction of the solar cell, a voltage drop cannot be neglected. This raises various problems. In the case where the distance from the probes to a short-circuited portion is short, a sufficient current flows through the short-circuited portion so that the short-circuited portion can be removed because the short-circuited portion is broken up or oxidized as described above. On the other hand, in the case where the distance from the probes to a short-circuited portion is long, a current flows through the short-circuited portion becomes insufficient so that the short-circuited portion cannot be removed because the short-circuited portion cannot be broken up or oxidized. If the reverse bias voltage is increased to surely remove the short-circuited portion remote from the probes, a large current flows through a short-circuited portion located near the probes, generating a large amount of heat, which may make the pin-holes larger. Also, a voltage higher than the breakdown voltage may be applied to normal device regions, thus damaging the normal regions.

The present inventors disclose in Jpn. Pat. Appln. KOKAI Publication No. 10-4202 a reverse biasing apparatus which has a pair of probe lines, each probe line having a plurality of point-contact probes per string or having one or a plurality of line-contact probes or surface-contact probes per string along the longitudinal direction of solar cells. The reverse biasing apparatus can make the distance between the probes and any short-circuited portions short enough to make the voltage drop negligible. Therefore, the apparatus can overcome problems that some short-circuited portions cannot be eliminated or normal regions are damaged.

In the conventional reverse biasing apparatus, a pair of probes (or a pair of probe lines) is moved downward to be in contact with the second electrode layers of a pair of solar cells, and a reverse biasing process is carried out, and then a pair of probes is moved upward and is moved to the position on the subsequent pair of solar cells. These operations are repeated corresponding to the number of strings of solar cells. In this case, since a plurality of point-contact probes are provided per string or one or a plurality of line-contact probes or surface-contact probes are provided per string in the longitudinal direction of solar cells, difference in height between the probes and the solar cells may inevitably be produced depending on the locations of the probes. In order to prevent solar cells from suffering mechanical damages caused by a large stress produced locally, the probes should be slowly moved downward. Therefore, it takes a long time to complete the reverse biasing process for all of the several tens of strings of solar cells, thus lowering the production efficiency of solar battery module. In addition, as the probes are moved up and down a number of times, the possibility of wear-originated machine failures increases.

Conventionally, the reverse biasing process is carried out by applying a dc reverse bias voltage or by applying a reverse bias voltage having a pulse-like rectangular waveform between a pair of probes 6a and 6b.

However, a solar battery is equivalent to a diode. When the reverse bias voltage is applied to the first electrode layer 2 and the second electrode layer 4, therefore, the solar cell 5 that comprises the first electrode layer 2, the photovoltaic semiconductor layer 3 and the second electrode layer 4 functions as a capacitor, so that charges are likely to be stored even after the voltage application is stopped. It has been found that a voltage induced by the stored charges may damage a weak portion of the photovoltaic semiconductor layer 3 other than the short-circuited portion. It has also become apparent that storage of charges by application of the reverse bias voltage occurs very easily and the adverse effect of the stored charges is greater than expected.

BRIEF SUMMARY OF THE INVENTION

Accordingly, it is an object of the present invention to provide a reverse biasing apparatus capable of efficiently performing a reverse biasing process on a solar battery module having integrated multiple strings of solar cells.

It is another object of the present invention to provide a reverse biasing apparatus which prevents other portions than short-circuited portions from being damaged by suppressing storage of charges between electrodes as much as possible at the time of performing a reverse biasing process on a solar battery module.

According to one aspect of the present invention, there is provided a reverse biasing apparatus for removing short-circuited portions in a solar battery module having a plurality of solar cells each including a first electrode layer, a photovoltaic semiconductor layer and a second electrode layer, all formed on a substrate, by applying a reverse bias voltage to individual solar cells, which apparatus comprises probes to be in contact with the second electrode layers of adjacent three or more solar cells; an actuator for actuating the probes up and down; and a relay switch for selecting, from the probes, a pair of probes to be in contact with the second electrode layers of an arbitrary pair of adjacent solar cells.

The apparatus of the present invention should preferably have probes to be in contact with the second electrode layers of five to ten adjacent solar cells. It is preferable that a plurality of point-contact probes should be provided per a single string of solar cell along a longitudinal direction thereof.

The apparatus of the present invention may further comprise a function generator for supplying a reverse bias voltage having a periodically changing waveform to the solar cells through the pair of probes, and a control unit for controlling an application time for the reverse bias voltage applied by the function generator. An amplifier incorporating a current limiter may be provided between the function generator and the probes.

With the above structure, a reverse biasing process is carried out by causing the function generator to supply a reverse bias voltage having a periodically changing waveform and a predetermined peak value to the probes for a predetermined period of time and then supply a reverse bias voltage having a periodically changing waveform and a peak value higher than the predetermined peak value to the probes for another predetermined period of time. In this case, it is preferable that the control unit should control a time of supplying a reverse bias voltage having a periodically changing waveform and a predetermined peak value to 0.2 second or less. It is also preferable that an initial reverse bias voltage be supplied to the probes from the function generator with a peak value of 2V or lower. It is preferable that the current limiter incorporated in the amplifier should perform control in such a way that an absolute value of a maximum current at a time of applying the reverse bias voltage is equal to or smaller than twice the short-circuit current when sunlight of AM 1.5 is irradiated on the solar cells.

According to the present invention, the reverse bias voltage in use has a waveform of a sinusoidal wave, a half sinusoidal wave, a sawtooth wave or a rectangular wave. The reverse bias voltage may essentially include a reverse bias component and partially include a forward bias component. The reverse bias voltage preferably has a frequency of 20 to 1000 Hz, and more preferably has a frequency of 50 to 120 Hz. The function generator may supply to the probes a forward bias voltage between a time of supplying a reverse bias voltage having a predetermined peak value and a time of supplying a reverse bias voltage whose peak value is higher than the predetermined peak value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A through 7C are diagrams exemplifying the waveforms of a reverse bias voltage used in the present invention;

FIGS. 8A through 8D are diagrams showing different examples of the waveforms of the reverse bias voltage used in the present invention;

DETAILED DESCRIPTION OF THE INVENTION

Figure 1A:
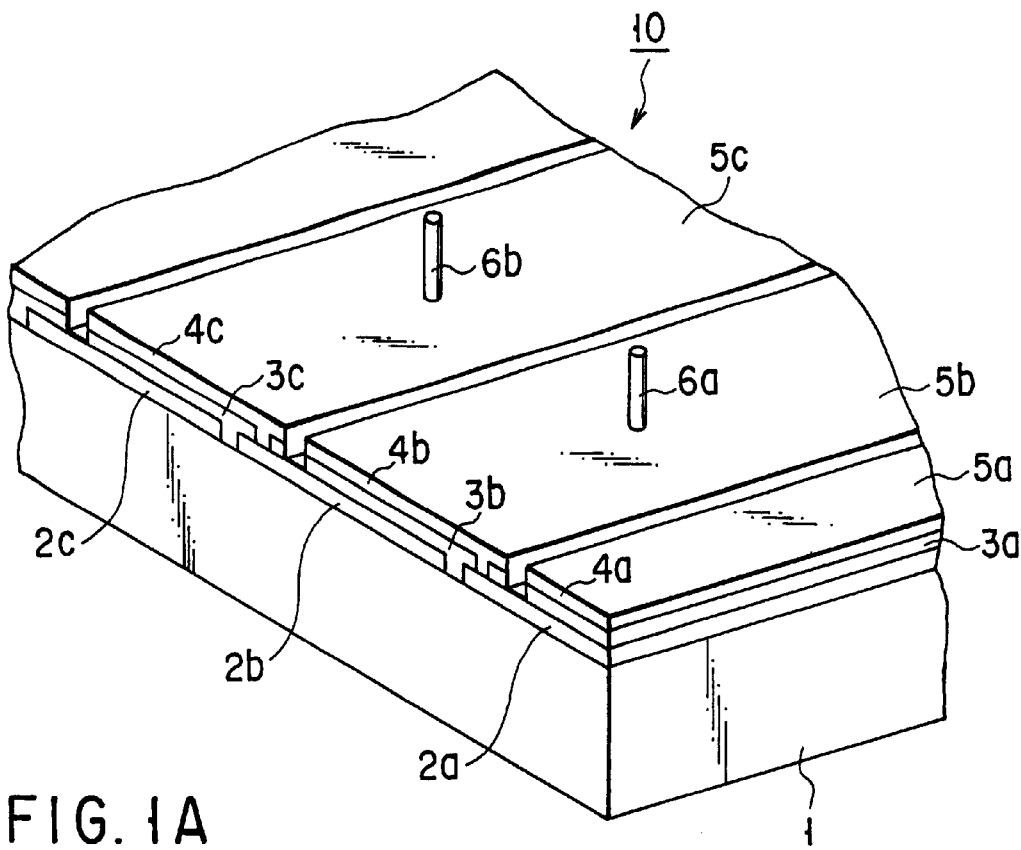
FIGS. 1A and 1B are a perspective view and a cross-sectional view for explaining a reverse biasing process.
Figure 1B:
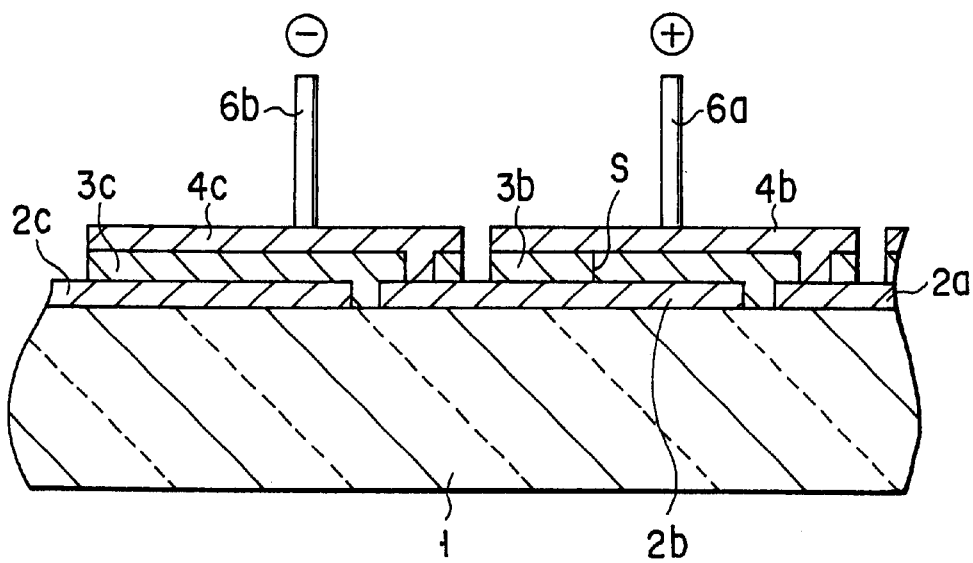

The present invention will now be described in details with reference to the accompanying drawings.

In the present invention, a thin-film solar battery module which is the target of a reverse biasing process has a plurality of solar cells each comprising a first electrode layer, a photovoltaic semiconductor layer and a second electrode layer deposited in order on an insulating substrate and processed into predetermined patterns. The solar cells are connected in series to one another.

When a glass substrate or a transparent resin substrate is used as the insulating substrate, a transparent electrode material such as ITO (Indium Tin Oxide) is used for the first electrode layer, and a metal electrode material for the second electrode layer. When a substrate material without a transparent property is used for the insulating substrate, on the other hand, a metal electrode material is used for the first electrode layer, and a transparent electrode material for the second electrode layer.

When the photovoltaic semiconductor layer is of an amorphous silicon-based semiconductor, the materials for the layer include amorphous silicon, hydrogenated amorphous silicon, hydrogenated amorphous silicon carbide, amorphous silicon nitride and amorphous silicon-based alloy containing silicon and another metal such as germanium and tin. Further, the material for the semiconductor layer is not limited to a silicon-based material but may be a CdS-based material, GaAs-based material or InP-based material. Those amorphous semiconductor layers or microcrystalline semiconductor layers are designed to form a pin, nip, ni, pn or MIS junction, heterojunction, homogeneous junction, Schottky junction or a combination of those junctions.

The term "probe" herein means some means (an electrode) for applying a reverse bias voltage to a solar cell. The contact portion of the probe to the second electrode layer may be a point, a line or a surface. It is preferable to provide a plurality of point-contact probes or one or a plurality of line-contact probes or surface-contact probes per a single string of a solar cell in a longitudinal direction thereof. With the probes provided this way, no short-circuited portions would be located remote from the probes, thus making it possible to avoid an adverse influence originated from a voltage drop.

When a line-contact or surface-contact probe contact the second electrode layer of the solar cell, the total contact length of one or a plurality of probes in the longitudinal direction should preferably be equal to or greater than 50% of the length of the solar cell.

In the reverse biasing apparatus of the present invention, two lines of probes are used to perform a reverse biasing process on one string of solar cells by switching. Therefore, (n−1) strings of solar cells are subjected to the reverse biasing process by switching n lines of probes which contact the electrodes of the solar cells. According to the present invention, while three or more lines of probes suffice, it is more preferable to provide five to ten lines of probes. If the number of lines of probes is small, the overall efficiency of the reverse biasing process is not improved much. If the number of lines of probes is too large, however, it becomes difficult to make all the probes contact the electrodes of the solar cells with uniform pressure, so that cells are likely to suffer mechanical damages locally.

With the use of the reverse biasing apparatus of the present invention, the probes are moved downward to be in contact with the second electrode layers of the solar cells, and then plural strings of solar cells can be subjected to the reverse biasing process by a switching operation. This can significantly reduce the number of actuating operations of the probes in the vertical direction that take the longest time, as compared with the prior art, and can thus improve the overall efficiency of the reverse biasing process.

Figure 2A:
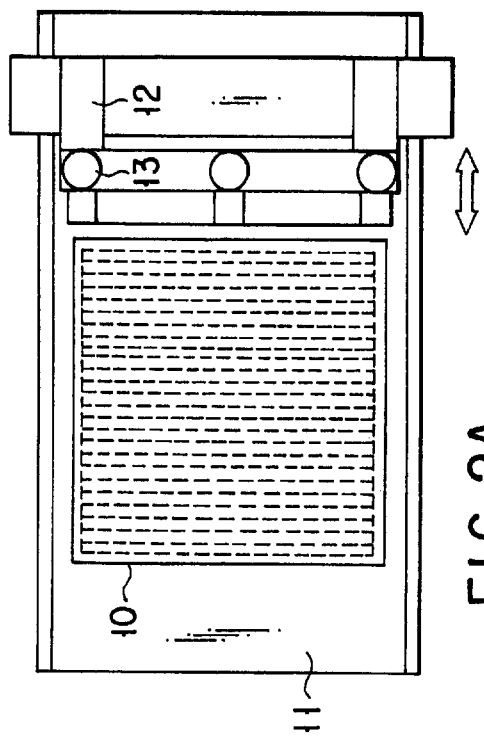
FIG. 2A is a plan view showing a reverse biasing apparatus according to one embodiment of the present invention.
Figure 2B:
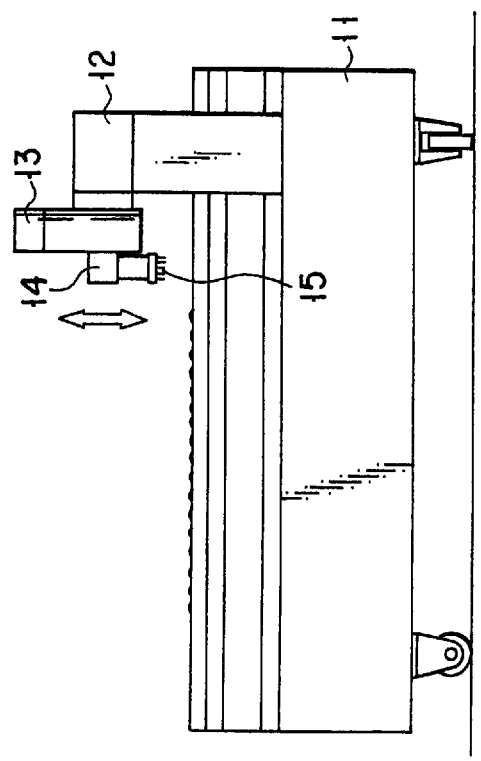
FIG. 2B is a side view of the reverse biasing apparatus in the longitudinal direction thereof.
Figure 2C:
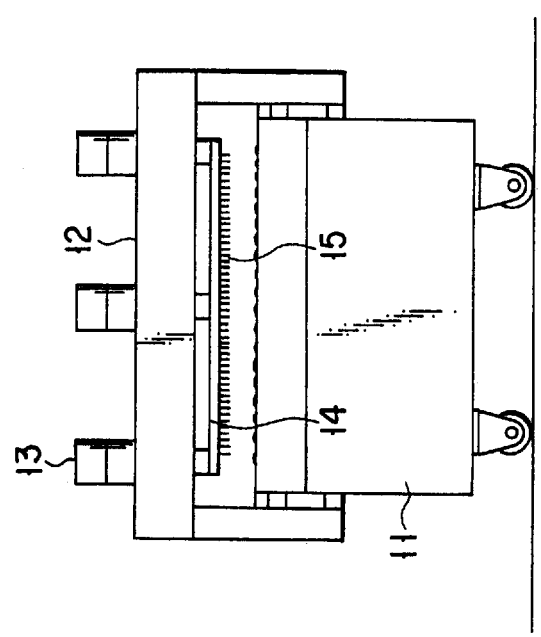
FIG. 2C is a side view of the reverse biasing apparatus in the widthwise direction thereof.

Some embodiments of the present invention will now be discussed referring to the accompanying drawings. FIG. 2A is a plan view of a reverse biasing apparatus embodying the present invention, FIG. 2B is a side view of the apparatus in the longitudinal direction thereof, and FIG. 2C is a side view of the apparatus in the widthwise direction thereof.

As shown in FIG. 2A, a solar battery module 10 is placed as a work on a table 11. The solar battery module 10 has a first electrode layer (transparent electrode), a semiconductor layer and a second electrode layer (back electrode) stacked on a glass substrate. The solar battery module 10 is fed in by a conveyor (not shown) from one side in the longitudinal direction (indicated by the arrow in FIG. 2A) of the apparatus, for example, the left-hand side in the figure, and fed out by another conveyor (not shown) provided on the other side, e.g., the right-hand side in the figure. The solar battery module 10 has a size of 840 to 910 mm in length and 423 to 910 mm in width, and is placed on the table 11 with the longitudinal direction of the solar cells (the direction of the scribe lines) set perpendicular to the longitudinal direction of the apparatus. It is assumed that the solar battery module has 40 strings of solar cells integrated therein.

At the upper portion of one side of the table 11, a stepping mechanism 12 for moving the probes horizontally is provided. At the upper portion of the stepping mechanism 12, an elevating mechanism 13 for moving the probes vertically is provided. A probe holder 14 is attached to the elevating mechanism 13, with multiple probes 15 attached to the bottom of the holder 14.

Although the stepping mechanism 12 is used in this embodiment, an X-Y table may be used instead to move the solar battery module horizontally.

Figure 3:
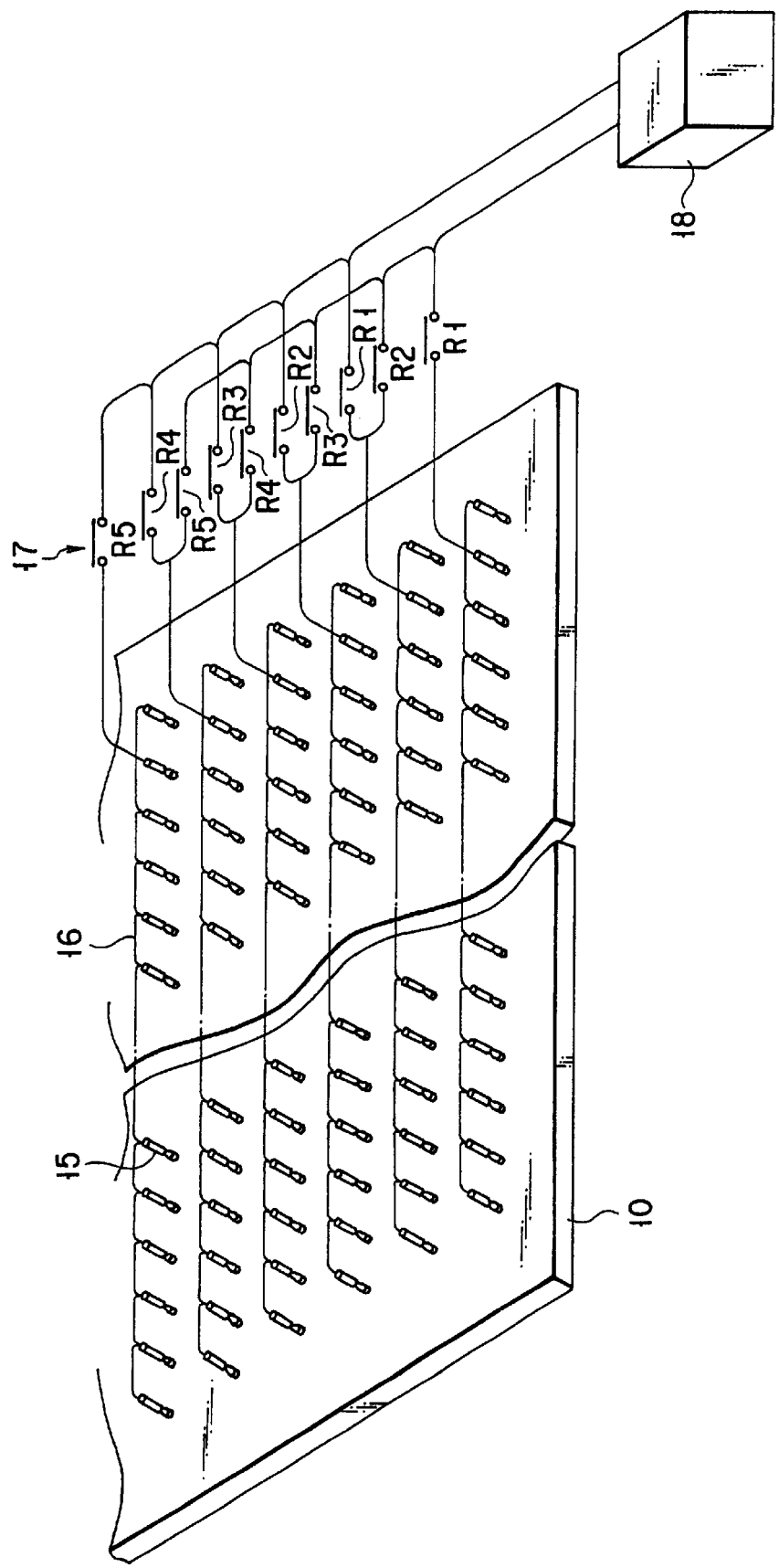
FIG. 3 is a diagram illustrating the layout of probes in the reverse biasing apparatus in FIG. 2.

As shown in FIG. 3, six lines of probes 15 are so provided as to be elevated together, each probe line having approximately 30 probes provided at equal intervals of 30 mm so as to be able to cover the entire length of a solar cell string. The probes 15 in each line are connected together by a common connecting wire 16. Ends of the connecting wires 16 are connected to associated switches in a relay switch 17 which selects, from six lines of probes, one pair of probe lines which apply the reverse bias voltage between the electrodes of any given pair of adjacent solar cells. The switching order of the relay switch 17 is indicated by R1 to R5. Those switches in the relay switch 17 are connected to a reverse-bias voltage supply 18.

The operation of the reverse biasing apparatus will be discussed below. The solar battery module is carried onto the table 11 by a conveyor (not shown) and is positioned based on alignment marks (not shown). Next, the stepping mechanism 12 is activated to move the elevating mechanism 13, the holder 14 and the probes 15 above the solar cells to be subjected to the reverse biasing process. Then, the elevating mechanism 13 is activated to slowly move the holder 14 and the probes 15 downward to be in contact with the second electrode layers at the surfaces of the solar cells, with such a care as to avoid local application of large stress that may mechanically damage the cells.

First, the switch R1 of the relay switch 17 is connected to energize two probe lines at the right-hand end to perform the reverse biasing process on the rightmost solar cells. Then, the switch R2 is connected to energize two probe lines on the second and third strings from the right-hand end to carry out the reverse biasing process on the second string of solar cells from the rightmost one. The switching operation is performed this way until the reverse biasing process is performed on the fifth string of solar cells. As the reverse biasing process is performed on one string of solar cell by using a pair of probe lines, switching the six lines of probes by the relay switch 17 can permit five strings of solar cells to be subjected to the reverse biasing process. Because multiple (approximately 30) probes are provided for one string of solar cell, the distance from the probes to short-circuited portions falls within a range (15 mm at a maximum, a half of the intervals of 30 mm between the probes) where a voltage drop is insignificant. The apparatus is therefore free of such a problem that some short-circuited portions cannot be removed or normal regions may be damaged.

Subsequently, the elevating mechanism 13 is activated to move the holder 14 and the probes 15 upward and the stepping mechanism 12 is then enabled to move the elevating mechanism 13, so that the holder 14 and the probes 15 above those solar cells to be subjected to the reverse biasing process next. Then, the above-described voltage application is repeated. To accomplish the reverse biasing process on 40 strings of solar cells using the reverse biasing apparatus of the present invention, a sequence of the step movement of the probes, the lift-down of the probes, the reverse biasing process using the relay switch 17 and the lift-up of the probes has only to be repeated eight times. This means an improvement on the production efficiency about five times that of the case of using the conventional reverse biasing apparatus that requires 40 repetitions of such a sequence in order to accomplish the reverse biasing process on 40 strings of solar cells. As the reverse biasing apparatus of the present invention involves fewer upward and downward movements of the probes than the conventional apparatus, the number of probable wear-originated machine failures will be reduced.

Figure 4:
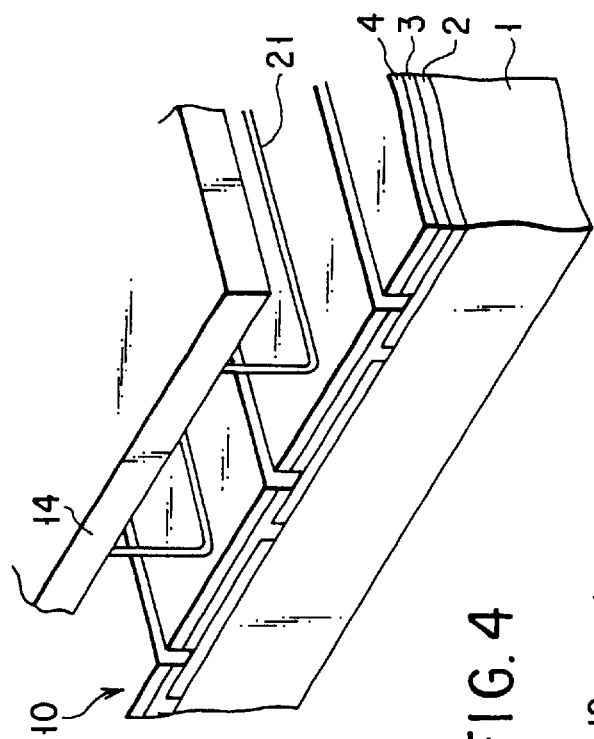
FIG. 4 is a perspective view showing a reverse biasing apparatus according to another embodiment of the present invention.
Figure 5:
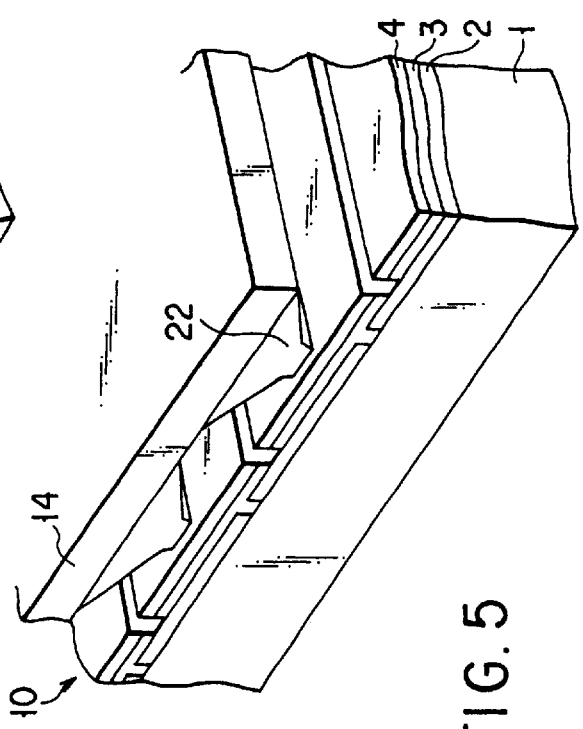
FIG. 5 is a perspective view showing a reverse biasing apparatus according to a further embodiment of the present invention.

Incidentally, the shape of the probes is not particularly limited. For example, it is possible to use liner probes 21 which make a line-contact with the back electrodes 4 of the solar cells 10 as shown in FIG. 4. Alternatively, block probes 22 which make a surface-contact with the back electrodes 4 of the solar cells 10 may be used as shown in FIG. 5.

The reverse biasing apparatus of the present invention may further comprise a function generator which supplies a reverse bias voltage having a periodically changing waveform to the solar cells through a pair of probes, and a control unit which controls an application time for the reverse bias voltage supplied by the function generator. An amplifier incorporating a current limiter may be provided between the function generator and the probes. Those means can control a waveform of the reverse bias voltage, a peak value thereof, an application time and a manner to apply the reverse bias voltage. This makes it possible to prevent other portions than short-circuited portions from being damaged by suppressing storage of charges between electrodes as much as possible at the time of performing the reverse biasing process on the solar battery module. The means and scheme that will be discussed below can be adapted to a reverse biasing apparatus which has only one pair of probes (or probe lines).

Figure 6:
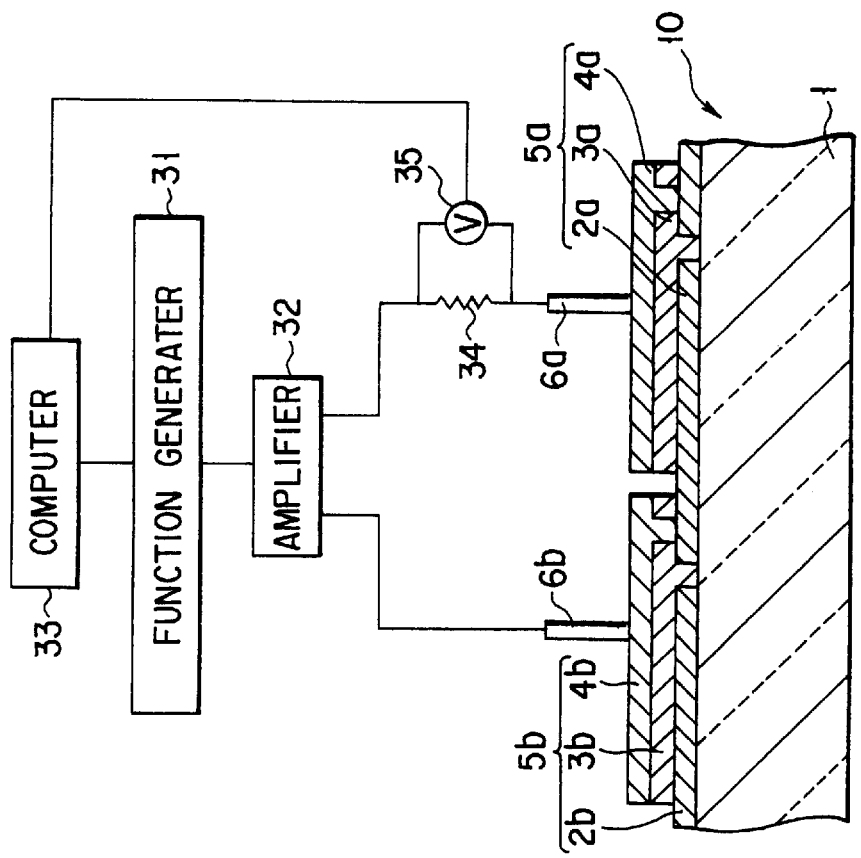
FIG. 6 is a diagram illustrating the circuit constitution of the reverse biasing apparatus according to an embodiment of the present invention.

Referring to FIG. 6, the reverse biasing apparatus having the aforementioned means will be described specifically. As shown in FIG. 6, a pair of probes 6a and 6b are brought into contact with a second electrode layer 4a of a solar cell 5a and a second electrode layer 4b of an adjacent solar cell 5b. Those probes 6a and 6b are supplied with a reverse bias voltage having a periodically changing waveform from a function generator 31 via an amplifier 32 incorporating a current-limiter. The application time for the reverse bias voltage supplied from the function generator 31 is controlled by a computer 33. A resistor 34 is inserted between the probe 6a and the amplifier 32 and a voltage applied across the resistor 34 is measured by a digital voltmeter 35. The peak value of the reverse bias voltage measured by the digital voltmeter 35 is input to the computer 33 and is fed back to the function generator 31 so that the reverse bias voltage having a predetermined peak value is applied to the probes. The computer 33 also controls the X-Y movement of the table (not shown) on which the solar battery module 10 is placed and the elevation of the table and the probes.

FIGS. 7A through 7C exemplify the waveforms of the reverse bias voltage that has a periodically changing waveform and is supplied to the solar cells via the probes. FIG. 7A shows the reverse bias voltage having a sinusoidal wave. In FIG. 7B, the reverse bias voltage has a half sinusoidal wave. FIG. 7B shows the reverse bias voltage having a sawtooth wave.

Applying such a reverse bias voltage can ensure effective discharging of charges that have been stored in a period in which the voltage value is 0V and a period in which the voltage value approaches 0V from the peak value. This can suppress damages being made on other portions than short-circuited portions by the stored charges.

It is preferable that the frequency of the reverse bias voltage match with the time constant defined by the capacitance C of the solar battery and the resistor R in the reverse direction. Setting the frequency of the reverse bias voltage in the above manner can allow the waveform of the applied voltage to follow up the waveform of the supply voltage. Specifically, the frequency of the reverse bias voltage is set in a range of 20 to 1000 Hz, more preferably in a range of 50 to 120 Hz.

According to the present invention, the reverse bias voltage having a periodically changing waveform supplied to the solar cells from the function generator via the probes may essentially include a reverse bias component and partially include a forward bias component. The waveforms of such a reverse bias voltage are exemplified in FIGS. 8A–8D. The reverse bias voltage shown in FIG. 8A has a sinusoidal wave partially containing a forward bias component. The reverse bias voltage shown in FIG. 8B likewise has a half sinusoidal wave partially containing a forward bias component. The reverse bias voltage shown in FIG. 8C has a rectangular wave partially containing a forward bias component. The reverse bias voltage shown in FIG. 8D has a sawtooth rectangular wave partially containing a forward bias component.

When the reverse bias voltages having the above waveforms are applied, it is possible to further reduce the charges stored between the first and second electrode layers 2 and 4 at the time the forward bias component is applied. This leads to suppression of damages on the normal regions.

According to the present invention, it is preferable to set the application time for the reverse bias voltage (indicated by $T_1$ in FIGS. 7 and 8) to 0.2 second or less. In this case, it is sufficient for the application time for the reverse bias voltage to be a reciprocal of the frequency of the reverse bias voltage or more. For instance, when a sinusoidal wave with a frequency of 60 Hz is applied as the reverse bias voltage in the present invention, the application time for the reverse bias voltage is equivalent to a time of 1 to 12 cycles. Apparently, it is possible to suppress the storage of charges in the solar cells as much as possible by applying the reverse bias voltage for a short period of time of 0.2 sec or less.

It is also preferable that an initial reverse bias voltage to be supplied to the probes from the function generator has a peak value of 2V or lower.

It is preferable that the current limiter incorporated in the amplifier should perform control in such a way that the absolute value of the maximum current at the time of applying the reverse bias voltage is equal to or smaller than twice the short-circuit current when sunlight of AM 1.5 is irradiated on the solar cells. This control can prevent the structure of the solar cells from being damaged by application of excess power. It is also possible to implement an effective reverse biasing process by carrying out the process with an intermediate current (equal to or smaller than twice the short-circuit current) and a large voltage (lower than the breakdown voltage), not with a large current and a small voltage.

It is further preferable to repeat the application of the reverse bias voltage having a periodically changing waveform for 0.2 sec or less while sequentially increasing the peak value of the reverse bias voltage.

The above control provides the following advantages. In general, the breakdown voltage of solar cells is 8 to 10V. If a relatively high reverse bias voltage of 4V or higher, though it is lower than the breakdown voltage, is applied to such solar cells from the beginning, the short-circuited portions may become difficult to be removed in some cases. That is, with some short-circuited portions remaining, the reverse bias voltage and the leak current, which flows from the short-circuited portion, would be proportional to each other and show a linear V-I characteristic, so that the leak current would rapidly decrease after the short-circuited portions are removed. If a reverse bias voltage having a high peak value is applied from the beginning, however, the observed leak current may become greater than the straight line of the estimated V-I characteristic. If a reverse bias voltage having a higher peak value is further applied, the increasing tendency of the leak current becomes often more prominent, making it further difficult to remove the short-circuited portions.

By repeating the reverse biasing in a short time while changing the peak value of the reverse bias voltage from a value of 2V or lower to a higher value, it is possible to determine from the changing tendency of the leak current if a short-circuited portion in a solar cell is removable or is hard to be eliminated. This makes it possible to adequately determine whether reverse biasing should continue or should be stopped, thus ensuring the optimal reverse biasing process.

Figure 9:
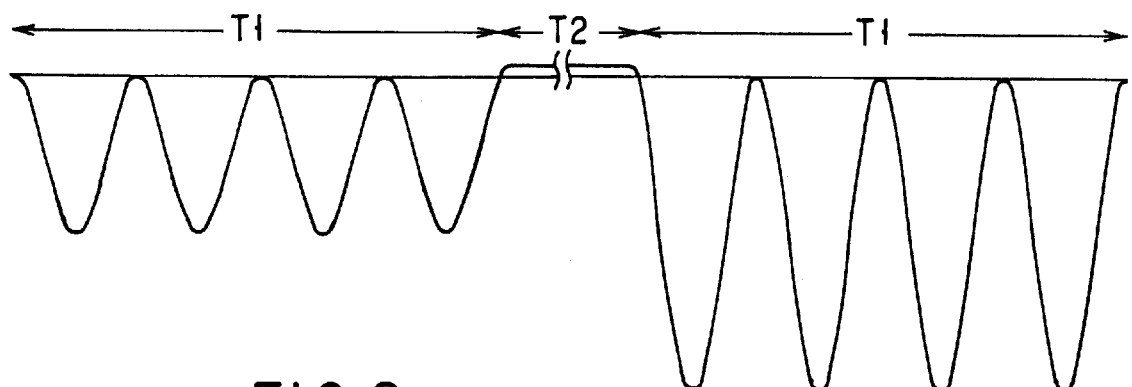
FIG. 9 is a diagram showing another example of the waveform of the reverse bias voltage used in the present invention.

As shown in FIG. 9, a forward bias voltage of −0.5V or smaller may be applied for a time $T_2$ in the above-described reverse biasing process between the time ($T_1$) for a certain application of the reverse bias having an initial peak value and the time for the next application of the reverse bias voltage whose peak value is higher than the former peak value. The application of the forward bias voltage for the time $T_2$ can further reduce the charges stored between the first and second electrodes 2 and 4, thus suppressing damages on the normal regions.

The following describes the actual results of comparing the effects of the present method with the conventional method used in the case of performing the reverse biasing process on the individual cells of a solar battery module which has 60 solar cells integrated in series.

The reverse biasing process was carried out using the reverse biasing apparatus of the present invention under the following schedule while applying the reverse bias voltage and forward bias voltage. At this time, the current to be measured was restricted to smaller than twice the short-circuit current.

(1) A reverse bias voltage with a sinusoidal wave having a frequency 60 Hz and a peak value of 2V was applied for 0.17 second.

(2) A dc forward bias voltage of −0.1V was applied for 0.17 second.

(3) A reverse bias voltage with a sinusoidal wave having a frequency 60 Hz and a peak value of 4V was applied for 0.17 second.

(4) A dc forward bias voltage of −0.1V was applied for 0.17 second.

(5) A reverse bias voltage with a sinusoidal wave having a frequency 60 Hz and a peak value of 6V was applied for 0.17 second.

(6) A dc forward bias voltage of −0.1V was applied for 0.17 second (the total processing time being 1.02 seconds). In this case, 58 cells out of 60 cells showed an excellent conversion characteristic.

By way of contrast, the reverse biasing process was performed by applying rectangular pulses having a frequency of 60 Hz and a peak value of 4V for 1.0 sec according to the conventional method without any current restriction. In this case, only 50 cells out of 60 cells showed an excellent conversion characteristic. The comparison results prove that the reverse biasing process according to the present invention is extremely effective.

It is to be noted that the way of changing the reverse bias voltage is not limited to the one illustrated in FIG. 9 but various ways are available to change the reverse bias voltage.

According to the present invention, a leak current may be measured by applying a reverse bias voltage to a solar cell and the reverse biasing may be terminated when the leak current becomes equal to or less than a permissible value. Further, a sequence of measuring the leak current by applying a reverse bias voltage having a first peak value to the solar cells, then measuring the leak current by applying a reverse bias voltage whose peak value is higher than the first value when the leak current exceeds the permissible value. In this time, if the leak current does not show a tendency to increase, then measuring the leak current by applying a reverse bias voltage having a higher peak value than the former value may be repeated. On the other hand, if the leak current shows a tendency to increase, then the application of the reverse bias voltage may be terminated.

One example of such reverse biasing will now be discussed by referring to the voltage-current (V-I) characteristic shown in FIG. 10. The "prior art" shown in FIG. 10 indicates the V-I characteristic of the solar cells when a relatively high dc reverse bias voltage or a reverse bias voltage having a pulsed rectangular waveform of 4V or higher is applied from the beginning so that the short-circuited portions become difficult to be eliminated.

Figure 10:
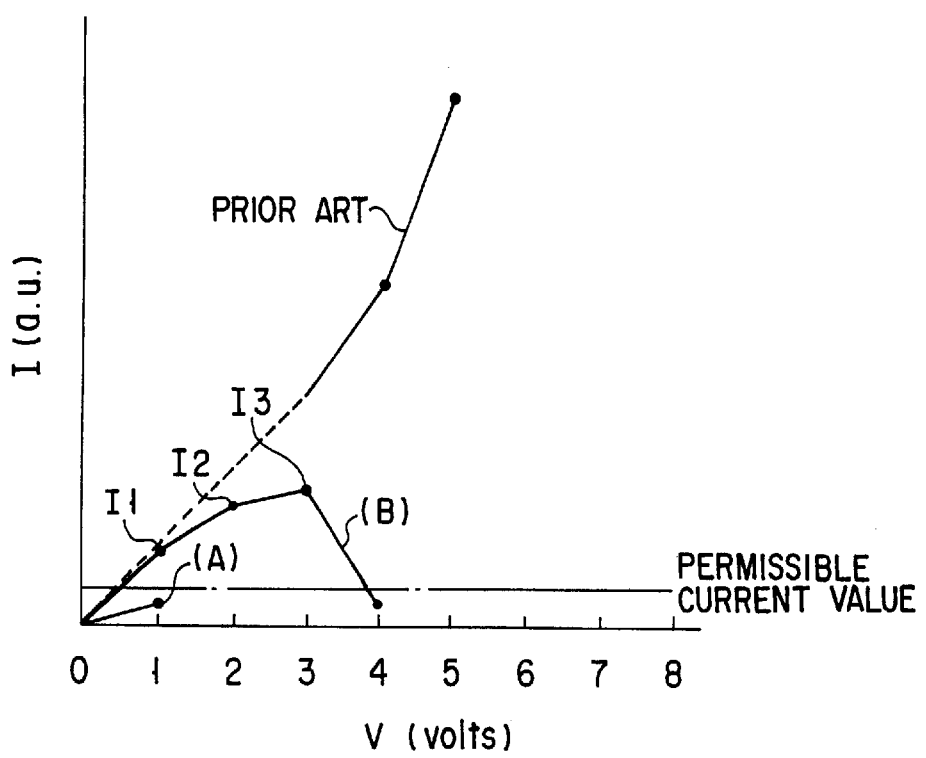
FIG. 10 is a voltage-current characteristic diagram for explaining an example of a reverse biasing process performed by the apparatus of the present invention.

For example, (A) in FIG. 10 shows the case where the leak current becomes lower than a permissible current value by applying a reverse bias voltage of 1V, so that the reverse biasing process is terminated.

Further, (B) in FIG. 10 shows an example of the reverse biasing process in the case where the leak current measured is greater than the permissible current value when the first reverse bias voltage is applied. In this case, the leak current value $I_1$ measured by applying the reverse bias voltage of 1V for the first time is greater than the permissible current value. Accordingly, a reverse bias voltage having a higher voltage value than the first voltage value (2V in this example, which is twice the voltage value in the first application) is applied and the leak current value $I_2$ is measured again, which is compared with the first leak current value $I_1$. When the ratio of the second leak current value to the first leak current value ($I_2/I_1$) is smaller than twice (where the leak current shows no tendency to increase), for example, it is possible to consider that the short-circuited portions in the solar cell can be eliminated. Therefore, a reverse bias voltage having a higher voltage value than that in the second application (3V in this example) is applied and the leak current value $I_3$ is measured again, which is compared with the first or second leak current value. When the third leak current shows no tendency to increase as in the previous case, it is possible to consider that the short-circuited portions in the solar cell can be eliminated. Accordingly, a still higher reverse bias voltage than that in the third application (4V in this example) is applied and the leak current value is measured again. In this example, as the application of the reverse bias voltage of 4V makes the leak current value lower than the permissible current value, the reverse biasing process is terminated then. This method can reliably eliminate removable short-circuited portions.

A description will now be given of another example of the reverse biasing process in the case where the leak current measured is greater than the permissible current value when the first reverse bias voltage is applied (this example is not shown in FIG. 10). It is likewise assumed that the leak current value $I_1$ measured by applying the reverse bias voltage of 1V for the first time is greater than the permissible current value. Accordingly, a reverse bias voltage having a higher voltage value than that in the first application (2V in this example) is applied and the leak current value $I_2$ is measured again, which is compared with the first leak current value $I_1$. When the ratio of the second leak current value to the first leak current value ($I_2/I_1$) is greater than twice, for example, three times or more (where the leak current shows some tendency to increase), elimination of the short-circuited portion becomes difficult. When such a tendency of the leak current to increase is observed, the reverse biasing process is terminated. This method can prevent the state of the short-circuited portion from getting worse.

The method of determining whether or not the leak current value is likely to increase is not limited to the above-described way of checking if the ratio of the second leak current value $I_2$ to the first leak current value $I_1$ is greater or smaller than the ratio of the second reverse bias voltage value to the first reverse bias voltage value, but may be accomplished by the following scheme. In the first application, the leak current value $I_1$ is acquired by applying the reverse bias voltage of 1V. In the second application, the leak current value $I_2$ is acquired by applying the reverse bias voltage of 2V. In the third application, the leak current value $I_1'$ is acquired by applying the reverse bias voltage of 1V again. If the third leak current value $I_1'$ is greater than the first leak current value $I_1$ and is 1.5 times $I_1$, for example, it is considered that the leak current value is likely to increase and the reverse biasing process is terminated then.

Actually, the reverse biasing process was performed according to the method of the present invention and the conventional method and their effects were compared with each other. When the reverse biasing process was performed on the individual cells of a solar battery module having 60 solar cells integrated in series, using the methods (A) and (B) in FIG. 10, 55 cells out of 60 cells showed an excellent conversion characteristic. On the other hand, when the reverse biasing process was performed by applying rectangular pulses having a peak value of 4V according to the conventional method, only 50 cells out of 60 cells showed an excellent conversion characteristic. The comparison results prove that the present method of eliminating short-circuited portions is extremely effective.

Since the conditions of short-circuited portions differ from one solar cell to another, the above-described reverse biasing process is carried out in various manners for the individual solar cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reverse biasing apparatus for removing short-circuited portions in a solar battery module having a plurality of solar cells each including a first electrode layer, a photovoltaic semiconductor layer and a second electrode layer formed on a substrate, the apparatus comprising:
   probes to be in contact with the second electrode layers of adjacent three or more solar cells;
   an actuator for actuating said probes up and down; and
   a relay switch for selecting, from said probes, a pair of probes to be in contact with the second electrode layers of an arbitrary pair of adjacent solar cells.

2. The apparatus according to claim 1, wherein the apparatus has probes to be in contact with the second electrode layers of five to ten adjacent solar cells.

3. The apparatus according to claim 1, wherein a plurality of point-contact probes are provided per a string of solar cells along a longitudinal direction thereof.

4. The apparatus according to claim 1, further comprising:
   a function generator for supplying a reverse bias voltage having a periodically changing waveform to the solar cells through said pair of probes; and
   a control unit for controlling an application time for said reverse bias voltage supplied by said function generator.

5. The apparatus according to claim 4, further comprising an amplifier provided with a current limiter between said function generator and said pair of probes.

6. The apparatus according to claim 4, wherein said function generator supplies a first reverse bias voltage having a first periodically changing waveform with a first peak value to said pair of probes for a first period of time and then supplies a second reverse bias voltage having a second periodically changing waveform with a second peak value higher than said first peak value to said pair of probes for a second period of time.

7. The apparatus according to claim 4, wherein said control unit controls said application time for supplying said reverse bias voltage having a periodically changing waveform and a peak value to 0.2 second or less.

8. The apparatus according to claim 4, wherein an initial reverse bias voltage to be supplied to said pair of probes from said function generator has a peak value of 2V or less.

9. The apparatus according to claim 5, wherein said current limiter incorporated in said amplifier performs control in such a way that an absolute value of a maximum current at a time of applying said reverse bias voltage is equal to or smaller than twice a short-circuit current when sunlight of AM 1.5 is irradiated on the solar cells.

10. The apparatus according to claim 1, wherein said reverse bias voltage has a waveform of a sinusoidal wave, a half sinusoidal wave, a sawtooth wave or a rectangular wave.

11. The apparatus according to claim 1, wherein said reverse bias voltage essentially includes a reverse bias component and partially includes a forward bias component.

12. The apparatus according to claim 1, wherein said reverse bias voltage has a frequency of 20 to 1000 Hz.

13. The apparatus according to claim 12, wherein said reverse bias voltage has a frequency of 50 to 120 Hz.

14. The apparatus according to claim 6, wherein said function generator supplies to said pair of probes a forward bias voltage between a time of supplying said first reverse bias voltage and a time of supplying said second reverse bias voltage.

15. A reverse biasing apparatus for removing short-circuited portions in a solar battery module having a plurality of solar cells each including a first electrode layer, a photovoltaic semiconductor layer and a second electrode layer formed on a substrate, the apparatus comprising:

a pair of probes to be in contact with the second electrode layers of adjacent solar cells;

a function generator for reverse biasing the solar cells by supplying a reverse bias voltage having a periodically changing waveform to the solar cells through said pair of probes; and a control unit for controlling an application time for said reverse bias voltage supplied by said function generator, wherein said control unit controls said reverse biasing as follows:

said control unit applies a first reverse bias voltage having a first peak value of 2V or less to the adjacent solar cells while measuring a leak current and terminates said reverse biasing when said leak current becomes equal to or less than a permissible value; and said control unit applies a second reverse bias voltage having a second peak value higher than said first peak value to the adjacent solar cells while measuring said leak current when said leak current by application of said first bias voltage exceeds said permissible value, and, (i) if said leak current by application of said second reverse bias voltage does not show a tendency to increase, then said control unit applies a third reverse bias voltage having a third peak value higher than said second peak value to the adjacent solar cells while measuring said leak current, where said control unit repeats application of said reverse bias voltage with a still higher peak value until said measured leak current becomes equal to or less than said permissible value, and (ii) if said leak current by application of the reverse bias voltage shows a tendency to increase, then said control unit A terminates said reverse biasing.

16. A reverse biasing apparatus for removing short-circuited portions in a solar battery module having a plurality of solar cells each including a first electrode layer, a photovolatic semiconductor layer and a second electrode layer formed on a substrate, the apparatus comprising:

a pair of probes to be in contact with the second electrode layers of adjacent solar cells;

a function generator for supplying a reverse bias voltage having a periodically changing waveform with a peak value to the solar cells through said pair of probes; and a control unit for controlling an application time for said reverse bias voltage supplied by said function generator, wherein said function generator supplies a first reverse bias voltage having a first peak value to the adjacent solar cells for a first period of time, and then supplies a second reverse bias voltage having a second peak value higher than said first peak value to the adjacent solar cells for a second period of time, while sequentially increasing said peak value of said reverse bias voltage, and wherein said function generator supplies a forward bias voltage between said first period of time of supplying said first reverse bias voltage and said second period of time of supplying said second reverse bias voltage.

17. A reverse biasing apparatus for removing short-circuited portions in a solar battery module having a plurality of solar cells each including a first electrode layer, a photovoltaic semiconductor layer and a second electrode layer formed on a substrate, the apparatus comprising:

a pair of probes to be in contact with the second electrode layers of adjacent solar cells;

a function generator for supplying a reverse bias voltage having a periodically changing waveform to the solar cells through said pair of probes; and a control unit for controlling an application time for said reverse bias voltage supplied by said function generator, wherein said control unit controls said application time for said reverse bias voltage so as to be 0.2 second or less.

18. A reverse biasing apparatus for removing short-circuited portions in a solar battery module having a plurality of solar cells each including a first electrode layer, a photovoltaic semiconductor layer and a second electrode layer formed on a substrate, the apparatus comprising:

a pair of probes to be in contact with the second electrode layers of adjacent solar cells;

a function generator for supplying a reverse bias voltage having a periodically changing waveform to the solar cells through said pair of probes;

a control unit for controlling an application time for said reverse bias voltage supplied by said function generator; and an amplifier provided with a current limiter between said function generator and said probes, wherein said current limiter incorporated in said amplifier performs control in such a way that an absolute value of a maximum current at a time of applying said reverse bias voltage is equal to or smaller than twice a short-circuit current when sunlight of AM 1.5 is irradiated on the solar cells.

* * * * *